United States Patent [19]

Appels et al.

[11] Patent Number: 5,008,209

[45] Date of Patent: Apr. 16, 1991

[54] A METHOD OF MANUFACTURING A SEMICONDUCTOR DEVICE INCLUDING OUTDIFFUSION FROM POLYSILICON RIMS

[75] Inventors: Johannes A. Appels; Henricus G. R. Maas, both of Eindhoven, Netherlands

[73] Assignee: U.S. Philips Corporation, New York, N.Y.

[21] Appl. No.: 463,183

[22] Filed: Jan. 10, 1990

Related U.S. Application Data

[60] Division of Ser. No. 828,076, Feb. 3, 1986, abandoned, which is a continuation of Ser. No. 447,845, Dec. 8, 1982, abandoned.

[30] Foreign Application Priority Data

Dec. 31, 1981 [NL] Netherlands ............... 8105920

[51] Int. Cl.⁵ ..................................... H01L 21/225
[52] U.S. Cl. ............................. 437/31; 437/44; 437/162; 437/239; 437/956; 437/968; 148/DIG. 131

[58] Field of Search ............ 437/160, 161, 162, 168, 437/44, 31, 32, 33, 956, 40, 41, 911, 238, 239, 968; 156/643; 748/DIG. 39, DIG. 123, DIG. 131; 357/34, 23.4

[56] References Cited

U.S. PATENT DOCUMENTS

| | | | |
|---|---|---|---|
| 4,209,349 | 6/1980 | Ho et al. | 437/41 |
| 4,209,350 | 6/1980 | Ho et al. | 156/643 |
| 4,419,809 | 12/1983 | Riseman et al. | 437/41 |
| 4,450,470 | 5/1984 | Shiba | 437/31 |
| 4,466,175 | 8/1984 | Coe | 437/44 |
| 4,483,726 | 11/1984 | Isaac et al. | 437/31 |
| 4,545,114 | 10/1985 | Ito et al. | 437/44 |
| 4,617,071 | 10/1986 | Vora | 437/31 |

Primary Examiner—Brian E. Hearn
Assistant Examiner—T. N. Quach
Attorney, Agent, or Firm—Paul R. Miller

[57] ABSTRACT

A method of manufacturing a semiconductor device is set forth using anisotropic etching techniques, such as plasma etching and reactive ion etching to obtain interconnection patterns having accurately defined rims. Various different kinds of transistors can be manufacturing in the same semiconductor body using these techniques.

6 Claims, 7 Drawing Sheets

5,008,209

A METHOD OF MANUFACTURING A SEMICONDUCTOR DEVICE INCLUDING OUTDIFFUSION FROM POLYSILICON RIMS

This application is a divisional application of previous application Ser. No. 06/828,076, filed Feb. 3, 1986, now abandoned which is a continuation of earlier application Ser. No. 06/447,845, filed Dec. 8, 1982, now abandoned, and all benefits of such earlier applications are hereby claimed for this new divisional application.

BACKGROUND OF THE INVENTION

The invention relates to a semiconductor device comprising a semiconductor body provided with a circuit element at the area of an opening in an insulating layer present on a surface of the semiconductor body and an interconnection pattern located at least in part on the insulating layer.

The invention further relates to a method of manufacturing such a semiconductor device.

The circuit element generally forms part of an integrated circuit and can be a (bipolar or unipolar) transistor as well as, for example, a resistor.

A semiconductor device of the kind mentioned in the preamble having a MOS transistor as circuit element is known from U.S. Pat. No. 3,699,646. This device comprises for a source or drain zone of the MOS transistor a pattern of silicon which is provided on a layer of thick oxide (field oxide). At the area of the transistor there is provided an opening in the field oxide within which the silicon pattern extends. At areas at which the pattern contacts a source or drain zone, this pattern is directly applied to the semiconductor body. At other areas, the (polycrystalline) silicon acts as a gate contact and is separated from the semiconductor body by a layer of thin oxide (gate oxide).

In the design of semiconductor devices, increasingly higher integration densities are aimed at, on the one hand in order to be able to realize a maximum number of functions on an equal surface area, and on the other hand in order to be able to attain higher yields in the manufacture due to the smaller surface area required for such a circuit arrangement.

In the transistor according to the U.S. Pat. No. 3,699,646, the minimum dimension of, for example, the source zone of the transistor is determined by the size of a diffusion window having dimensions dependent upon two tolerances. First, it is necessary for a satisfactory contacting that the material of the interconnection pattern covers the semiconductor surface over a minimum distance. In order to be sure of this, the relative tolerance of the masks defining the interconnection pattern and the opening in the field oxide, respectively, have to be taken into account.

Furthermore the size of the diffusion window is dependent upon the distance between this contacting area and the gate contact. During the manufacture of the transistor, an electrode of polycrystalline silicon is provided for the gate contact on a thin layer of oxide, which is then removed, the electrode being used as a mask. The distance between the contacting area of the source zone and the gate contact therefore depends in the first instance on the absolute tolerance of the mask defining the interconnection pattern because the contacts are formed therefrom.

When the size of the transistor is reduced, however, another tolerance will play a part. In order to ensure that, when the layer of thin oxide is removed, the gate electrode indeed covers this layer, the relative tolerance of the mask defining the thin oxide with respect to the mask defining the interconnection pattern has to be taken into account.

The said tolerances set limits to the size of the diffusion openings and hence to the dimensions of the transistor.

Furthermore, during the manufacture of semiconductor devices attempts are made to arrange different transistors, such as bipolar transistors and MOS transistors, in the same semiconductor body. In the said U.S. Patent mentioned above, one type of impurity is used for doping both the polycrystalline silicon and the source and drain zones of MOS transistors. The device shown thus comprises only one kind of transistor, in this case MOS-transistors of the same type (p-type or n-type).

SUMMARY OF THE INVENTION

The present invention has for its object to provide a semiconductor device, in which very small dimensions of the circuit elements can be realized and especially in bipolar transistors extremely small effective emitter surfaces can be attained. Moreover, it has for its object to provide a semiconductor device, in which different kinds of transistors (bipolar or unipolar transistors) can be formed in the same semiconductor body.

A semiconductor device according to the invention is characterized in that the interconnection pattern comprises a rim which at least at the area of the opening is separately provided with respect to the remaining parts of the interconnection pattern.

The invention is based on the recognition of the fact that such a rim, which joins the remaining part of the interconnection pattern, can be obtained with the aid of anisotropic etching techniques, such as, for example, plasma etching or reactive ion etching. With the aid of such techniques, the rim can be provided fully in a self-aligning manner so that the above-mentioned tolerances no longer set limits to the dimensions of the diffusion windows.

When these techniques are used, such a rim has side walls which are substantially at right angles to the semiconductor surface, while the whole upper surfaces of the rim and of the joining part of the interconnection pattern are substantially co-planar at least at the area of the opening. In this connection, it should be noted that outside the rim the interconnection pattern may comprise several layers, such as, for example, a layer of polycrystalline silicon embedded between two layers of insulating material.

A method of manufacturing a semiconductor device according to the invention is characterized in that the starting member is a semiconductor body having an insulating layer which is present on a surface and in which at least an opening is provided and on which a layer pattern is formed which extends at least as far as an edge of the opening, whereupon at least at the area of the opening the semiconductor conductor body and the layer pattern are provided with a layer of a material which is subjected to an anisotropic etching treatment so that a rim of this material is left in the opening on the semiconductor material and adjoining at least a part of the layer pattern.

Since after the definition of the layer pattern, the semiconductor body often is subjected to various further heat treatments, this pattern preferably comprises a layer of refractory material, such as, for example, tungsten, molybdenum or polycrystalline silicon.

A preferred embodiment of a method of manufacturing a semiconductor device according to the invention is characterized in that the layer pattern comprises a layer of polycrystalline semiconductor material, to which dopants are added, which cause a given conductivity type, and in that the material to be etched is semiconductor material with the device being subjected after the etching treatment to a heat treatment, in which the dopants diffuse into the semiconductor body.

Thus, diffusion zones of different conductivity types may be realized in the semiconductor body by ensuring that parts of the pattern have different conductivity type. As a result, various kinds of transistors and other semiconductor elements can be provided in the same semiconductor body.

BRIEF DESCRIPTION OF THE DRAWINGS

The invention will now be described more fully with reference to a few embodiments and the drawing, in which:

FIG. 19 is a schematic plan view and FIG. 20 is a schematic cross-sectional view taken on the lines XX—XX of a semiconductor device according to the invention, of which FIG. 21 shows the electric circuit diagram, while

Figure 1:
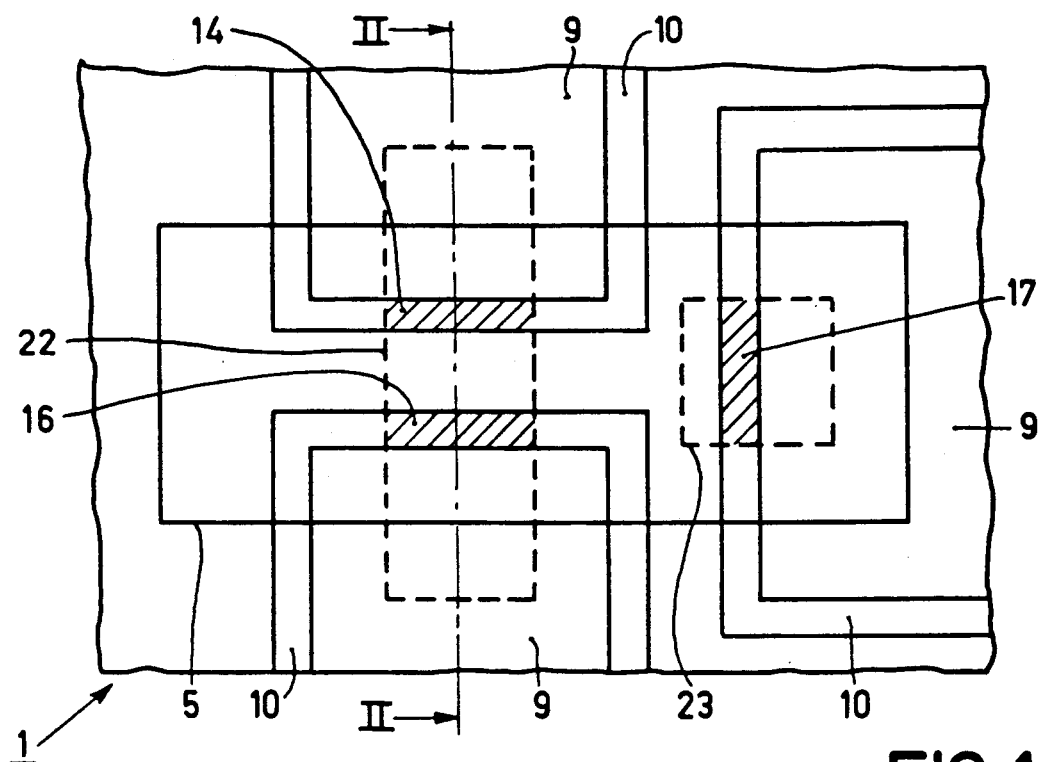
FIG. 1 is a schematic plan view of a semiconductor device according to the invention.

The figures are not drawn to scale, especially the dimensions in the direction of thickness being greatly exaggerated in the cross-sectional views for the sake of clarity. Semiconductor zones of the same conductivity type generally are cross-hatched in the same direction; in the figures, corresponding parts are generally designated by the same reference numerals.

DESCRIPTION OF THE PREFERRED EMBODIMENTS

Figure 2:
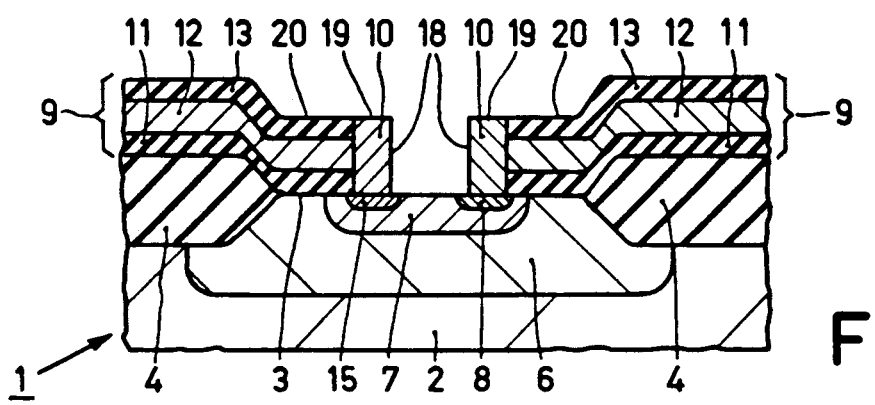
FIG. 2 is a schematic cross-sectional view taken on the line II—II in FIG. 1, FIGS. 3, 4, 5 and 6 are schematic cross-sectional views of the semiconductor device of FIG. 2 during different stages of its manufacture.

The semiconductor device 1 of FIGS. 1 and 2 comprises a p-type semiconductor body to, which is provided at its surface 3 with an insulating layer 4, which in this example is constituted by a layer of LOCOS oxide. The layer 4 has an opening 5 (see FIG. 1) at the area of a circuit element, in this example a bipolar transistor having an n-type collector zone 6, a p-type base zone 7 and an n-type emitter zone 8. Several transistors of this kind can be interconnected by means of an interconnection pattern 9, 10, which in this example is located partly on the LOCOS oxide and partly within the opening 5 on the semiconductor surface 3. In this example, the interconnection pattern 9, 10 comprises inter alia a three-layer structure 9 consisting of a first insulating layer 11, which again is made of silicon oxide, a second layer 12 of doped polycrystalline silicon and a third layer 13 of insulating material, which again may be silicon oxide. In the present example, the polycrystalline silicon is, viewed in the cross-sectional of FIG. 2, on the lefthand side p-type conducting and on the righthand side n-type conducting.

According to the invention, the interconnection pattern moreover comprises a rim 10, which contacts the transistor at areas which are indicated in the plan view of FIG. 1 by cross-hatched lines 14 (base contact), 16 (emitter contact) and 17 (collector contact). At the area of the base contact the base zone 7 moreover comprises a base contact zone 15 which is p-type conducting. In this example, the rims 10 consist of polycrystalline silicon, which at the area of the base contact 14 is p-type conducting and at the area of the emitter contact 16 and the collector contact 17 is n-type conducting. According to the invention, the rims 10 have side walls 18 which are substantially at right angles to the semiconductor surface 3, while upper surfaces 19 of the rims and adjoining parts 20 of the upper surface of the pattern constituted by the three-layer structure are located substantially in the same plane.

The semiconductor device shown in FIGS. 1 and 2 can be manufactured in the following manner (see FIGS. 3 to 6 inclusive).

The starting member is a p-type substrate 2 having a resistivity between 1Ω.cm and 100Ω.cm. Subsequently, the LOCOS insulation 4 is provided in a generally known manner by covering the surface 3 at the area of the desired openings 5 in the LOCOS oxide with an anti-oxidation layer consisting of a double layer of oxide-nitride (for example, 30 nm of nitride on 50 nm of oxide) whereupon oxidation is effected until the layer 4 has a thickness of 1 to 2/μm. The anti-oxidation layer is then removed and the collector region 6 is formed by diffusion or ion implantation. The ultimate collector region has a doping of approximately $5 \times 10^{17}$ phosphorus atoms/cm$^3$ and extends to a depth of 2 to 6/μm into the semiconductor body.

Figure 3:
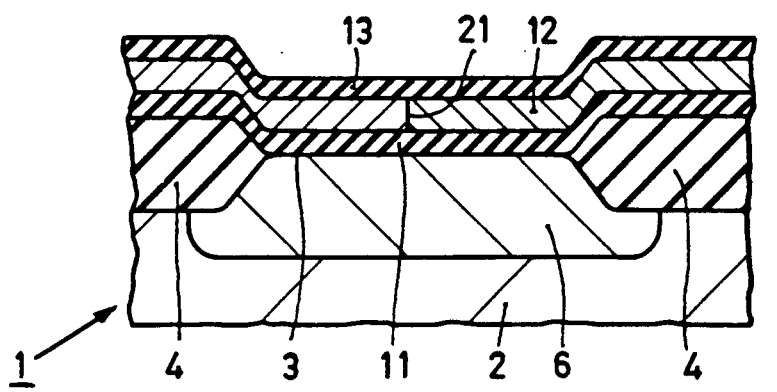

An oxide layer 11 is provided on the whole surface of the semiconductor device thus obtained, for example, by means of a deposition step. This layer 11 has a thickness of approximately 0.15/μm. Subsequently, a layer 12 of polycrystalline silicon is deposited thereon. This polycrystalline silicon, parts of which form part of the interconnection pattern in the finished device, is doped so that regions of n-conductivity type and p-conductivity type, respectively, are formed with pn-junctions 21 in the polycrystalline layer 12. These dopings can be provided by means of diffusion or implantation with the use of non-critical masking steps. In the present example, such a pn junction 21 is formed above the collector region 6. The device of FIG. 3 is then obtained.

In a next step, a photoresist mask 47 is provided by means of photolithographic techniques in order to define the parts 9 of the interconnection pattern. At the area of openings in this mask, the oxide layer 13 is removed, for example, in a buffered HF solution. After the photoresist mask 47 has been removed, the layers 12 of polycrystalline silicon and 11 of silicon oxide are removed with the use of the remaining oxide pattern 13 as a mask by means of plasma etching, the parts 9 of the interconnection pattern then being obtained.

A second photoresist mask is then provided having windows 22, 23 (see FIG. 1), which to a large extent overlap the edges 24 of the pattern 9 at the contacting areas to be formed. Through the subwindow constituted by parts of the window 22 and the edges 24 of the pattern 9, the base zone 7 is then provided. This may be effected, for example, by implantation of boron ions having a density of $10^{14}$ atoms/cm² at an energy of 5-10 keV. After a subsequent firing treatment, the base zone has a thickness of approximately $0.5/\mu m$. During the implantation, the window 23 is temporarily covered. In a similar manner, a collector contact zone is provided at the area of the window 23 while covering the window 22 by implantation or diffusion of phosphor.

In a slightly different method, the anti-oxidation layer is not removed immediately, but the collector region 6 is formed by ion implantation through this layer and a subsequent diffusion, whereupon at the area of the base region and the collector contact region windows are provided in this layer by means of a mask which leaves free windows 22, 23. After the layers 11, 12, 13 have grown again, the pattern 9 is formed again, inter alia by subjecting the layers 11 and 12 to plasma etching. This has the advantage that the nitride of the anti-oxidation layer acts as an etch stopper for the plasma etching process.

Figure 4:
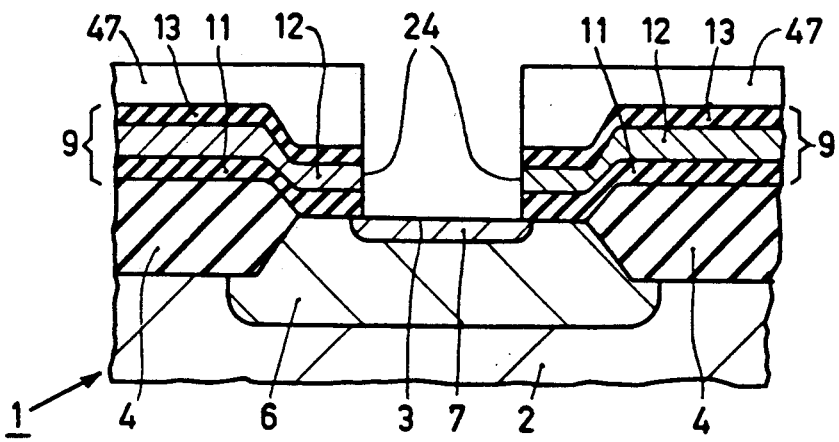
Figure 5:
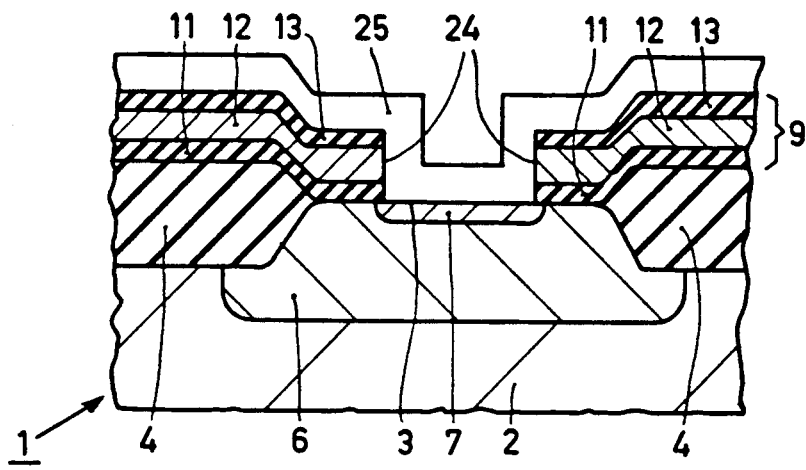

The semiconductor device of FIG. 4 is then covered with an approximately $0.1/\mu m$ thick layer 25 of undoped poly-crystalline silicon (see FIG. 5). The layer 25 thus obtained of polycrystalline silicon is then removed for the major part by means of an anisotropic etching treatment, for example, by bringing the layer in a tunnel reactor into contact with constituents of a plasma which is formed in a gas mixture containing chlorine or a chlorine compound. The layer 25 may also be obtained by epitaxial growth, the silicon at the area of the pattern 9 then growing in the form of polycrystalline silicon and on the semiconductor surface 3 in monocrystalline form.

Figure 6:
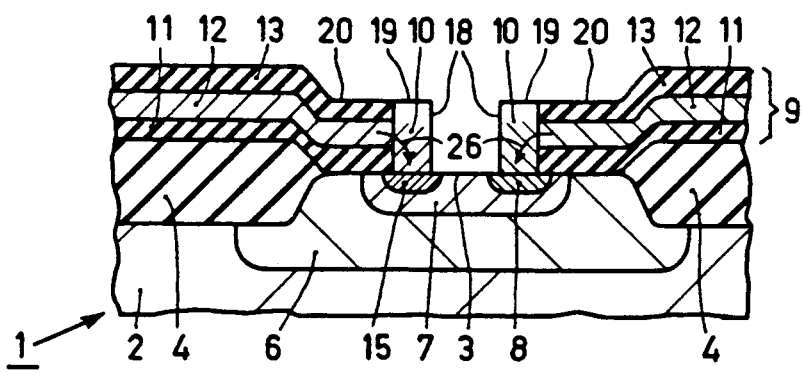

The result of the anisotropic etching treatment (plasma etching or reactive ion etching) is that only the rims 10 of the layer 25 are left (see FIGS. 1, 6). As a result of the anisotropic etching treatment, these rims have side walls 18 which are substantially at right angles to the surface 3 and the upper surface 19 of which is located in substantially the same plane as the upper surface 20 of the adjoining part of the pattern 9. In practice, a small level difference may then occur because the etching treatment is continued somewhat longer in order to be sure that the layer 25 is completely removed outside the rims 10. The rim 10 has a larger thickness than the layer 12 of polycrystalline silicon.

During a subsequent heat treatment at approximately 1000° C., n-type and p-type impurities diffuse from the polycrystalline layer 12 through the rims 10 into the semiconductor body, as is shown diagrammatically by arrows 26 in FIG. 6. Due to this diffusion, the emitter zone 8 and the base contact zone 15, respectively, are formed, while after the diffusion the rims 10 have the same conductivity type as the subjacent semiconductor zones and the adjoining parts of the layer 12 of polycrystalline silicon. The layer of polycrystalline silicon can then be considered for the rim 10 as a uniform doping source so that in this rim a diffusion profile is obtained in which the doping concentration of the impurities decreases in the direction towards the side wall 18. The device shown in FIG. 2 is now obtained.

Figure 7:
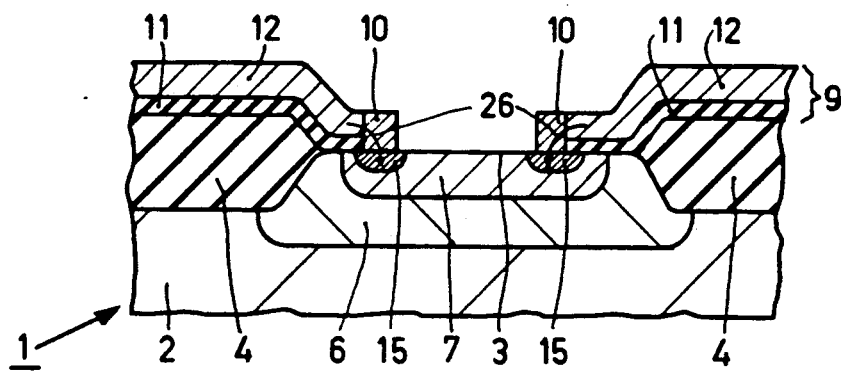
FIG. 7 shows diagrammatically a modification of the device of FIG. 2, FIGS. 8, 9, 10, 11 and 12 are schematic cross-sectional views of the various stages of manufacture of another device according to the invention.

If desired, the layer 13 may be omitted in the part 9 of the interconnection pattern. This is illustrated in FIG. 7, in which a resistor for use in an integrated circuit is shown in cross-section. The pattern 9 now comprises on both sides of the opening 5 an insulating layer 11 and a layer 12 of polycrystalline silicon, in the present example of the p-conductivity type. The rims 10 are, through contact zones 15, in contact with a high-ohmic zone 7 of the p-type, which is provided simultaneously with a base implantation and in this case acts as a resistance zone. Otherwise the reference numerals have the same meaning as in the preceding figures.

Figure 8:
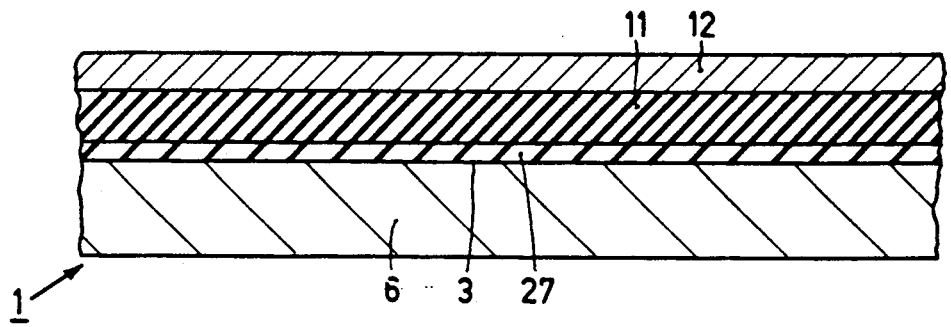

The manufacture of another bipolar transistor according to the invention is shown in FIGS. 8 to 12 inclusive. FIG. 8 shows part of an n-type collector zone 6. This collector zone may be contacted on the lower side of the semiconductor body, as in the case of a discrete transistor, or may be provided with a contact at a later stage, as in the case of an integrated circuit. In the case of an integrated circuit, such zones 6 are generally constituted by mutually insulated parts of an epitaxial layer which is grown on a p-type substrate. The surface 3 of the semiconductor body is covered with a layer 27 of silicon nitride, a layer 11 of silica and a layer 12 of a refractory metal, for example, molybdenum (see FIG. 8).

Figure 9:
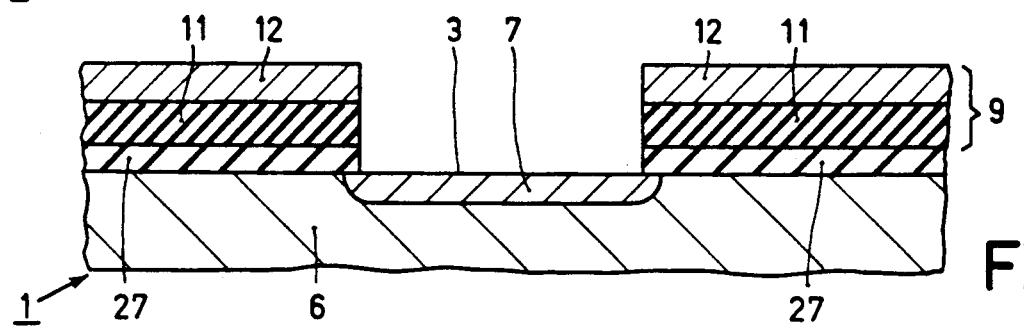

The double layer 11, 12 of oxide and molybdenum is then patterned by means of plasma etching. With the aid of a mask with relatively overlapping windows, comparable with the windows 22, 23 in FIG. 1, openings are then provided in the nitride in order to define a base window and a collector contact window. Subsequently, a p-type base zone 7 is formed through the base window by means of diffusion or implantation. The device of FIG. 9 is then obtained.

The base zone 7 thus formed is then partly covered with the aid of a non-critical mask 28, whereupon at the area of the exposed surface an emitter zone 8 is defined by ion implantation or diffusion. Simultaneously, if necessary, the doping of the collector zone is increased at the area of the collector contact window not shown in the cross-section. The device of FIG. 10 is then obtained.

Figure 10:
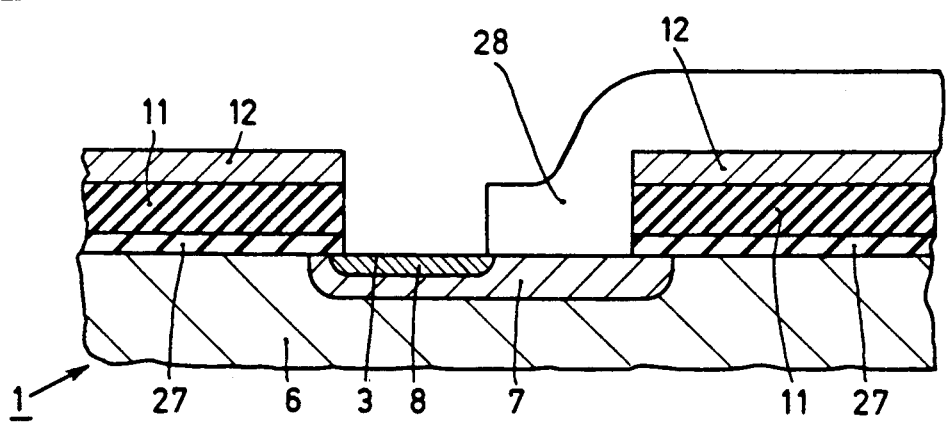
Figure 11:
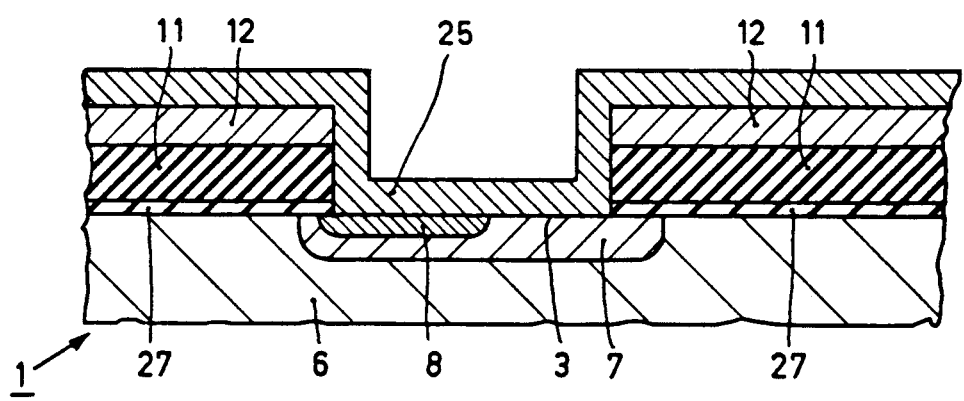
Figure 12:
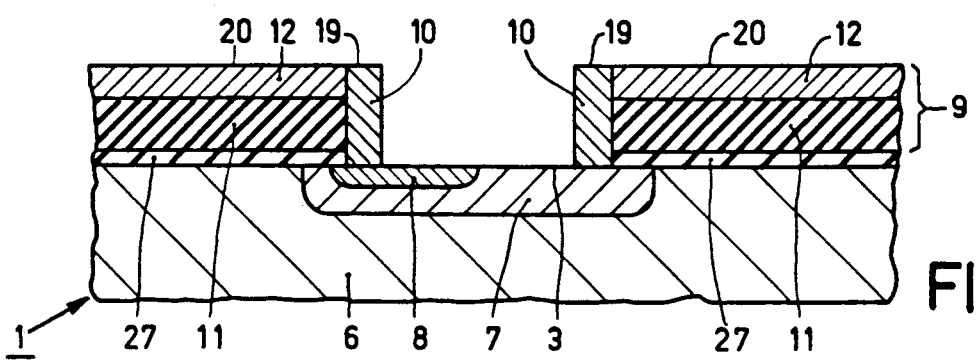

The device of FIG. 10 is then covered with a layer 25 of a first material, in the present example aluminium (FIG. 11), and subjected to an anisotropic etching treatment. FIG. 12 shows the end result, in which the base zone 7 and the emitter zone 8 of the transistor are electrically connected through aluminium rims 10 to the conductive layer 12 of molybdenum. This layer 12 forms part of the pattern 9, which forms with the rims 10 an interconnection pattern, in which the upper surfaces 19, 20 of the rims and the pattern, respectively, are located in substantially the same plane.

Figure 13:
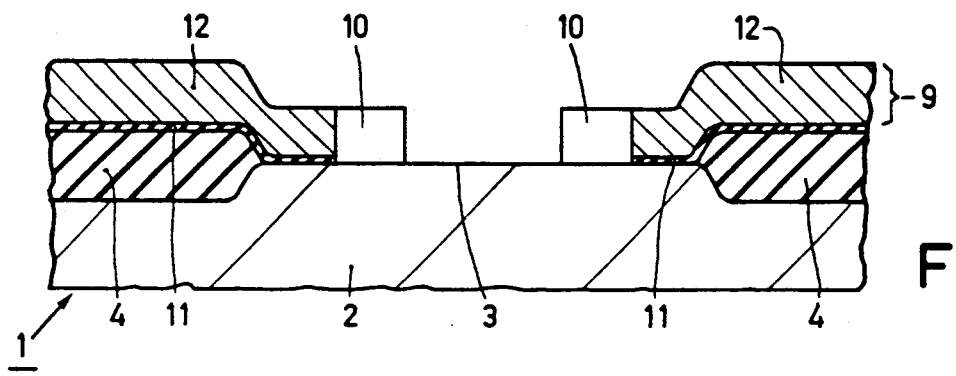
FIG. 13 is a schematic cross-sectional view of a semiconductor device according to the invention, which may serve as the starting point for the manufacture of a field effect transistor.

FIG. 13 shows a semiconductor device according to the invention having a p-type substrate 2, in which by means of local oxidation active regions are defined. An interconnection patter 9, 10 is present on the field oxide 4 and partly on the semiconductor surface 3, the pattern 9 being constituted by an oxide layer 11 and a layer 12 of n-type polycrystalline silicon. The rims 10 may consist of mono-crystalline or polycrystalline silicon. They may be undoped or may also be n-type conducting.

Figure 14:
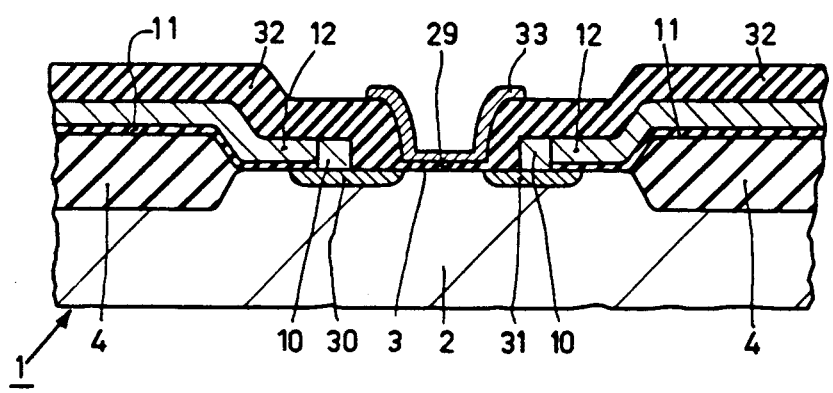
FIGS. 14 and 15 are schematic cross-ectional views of such field effect transistors.

When the device of FIG. 13 is subjected to an oxidation treatment, the oxide 29 grows on the weakly doped p-type silicon much more slowly than on the more highly doped (polycrystalline) n-type silicon. During the oxidation, in the case of doped rims 10, donors diffuse into the semiconductor body and thus constitute a source zone 30 and a drain zone 31. In the case of undoped rims, the donors first diffuse from the layer 12 into the rims and then into the semiconductor body. This diffusion is effected so rapidly that during the whole oxidation process the rims can be considered to be doped, which at the area of the rim 10 gives rise to a higher oxidation speed. The resulting oxide layer 32 therefore is much thicker than the gate oxide 29. On this thin oxide 29 there is then provided a gate electrode 33, for example, of aluminium. This electrode is allowed to partly overlap the source zone 30 and the drain zone 31 with adjoining rims 10 because any parasitic capacitance between the gate electrode 33 and the regions 30, 31 is strongly reduced by the oxide 32. The device of FIG. 14 is then obtained.

Figure 15:
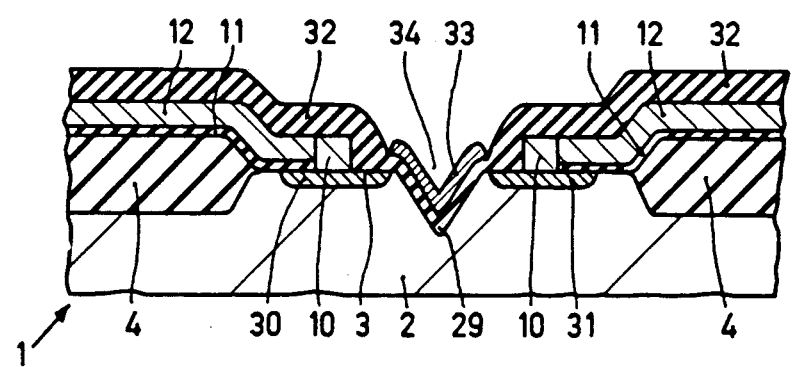

In the device of FIG. 15, a cavity 34 is provided between the source zone 30 and the drain zone 31 for carrying out the oxidation step; in this example, this cavity is constituted by a V-shaped groove, but also other shapes for the groove may be used, such as, for example, the U-shape. The reference numerals in FIG. 15 otherwise again have the same meaning as in FIG. 14.

Figure 16:
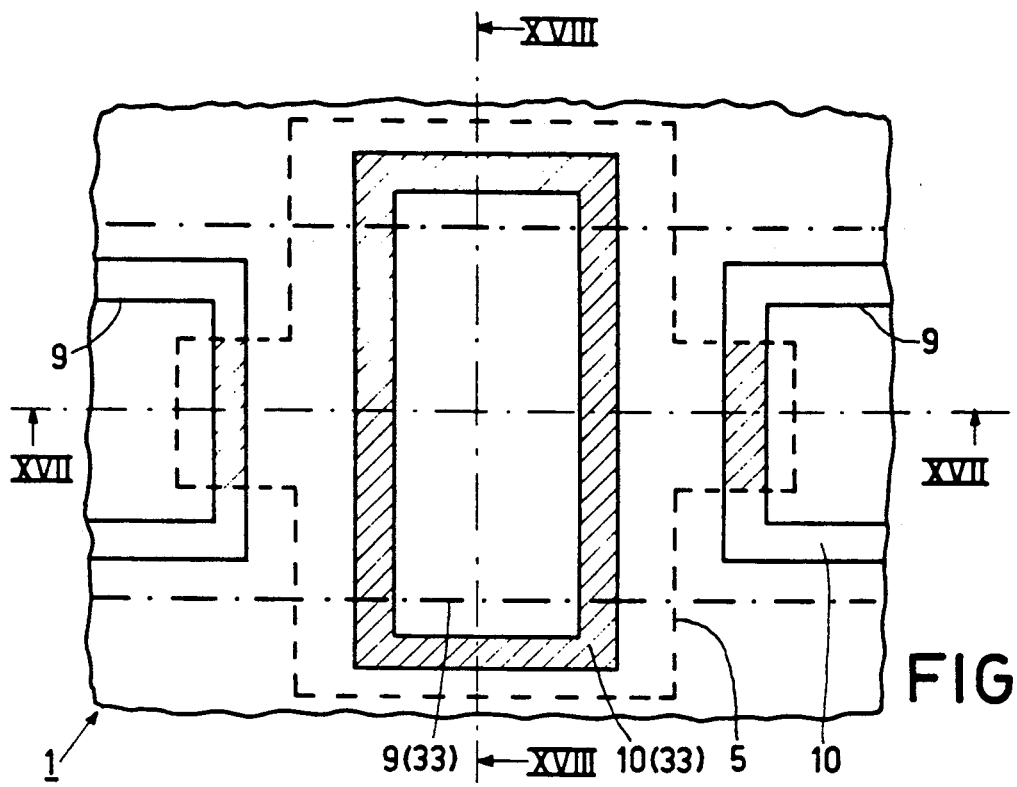
FIG. 16 is a schematic plan view of a junction field effect transistor according to the invention.
Figure 17:
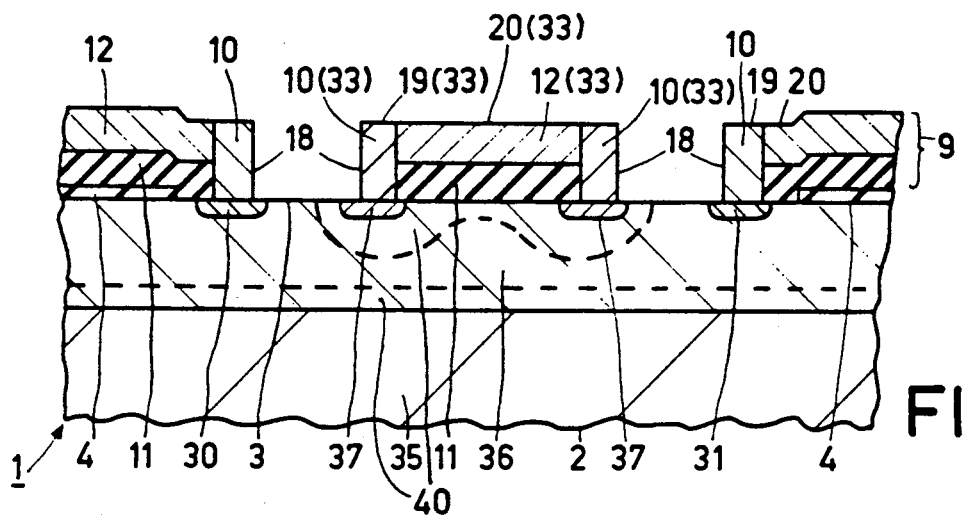
FIGS. 17 and 18 are schematic cross-sectional views taken on the lines XVII—XVII and XVIII—XVIII, respectively, in FIG. 16.
Figure 18:
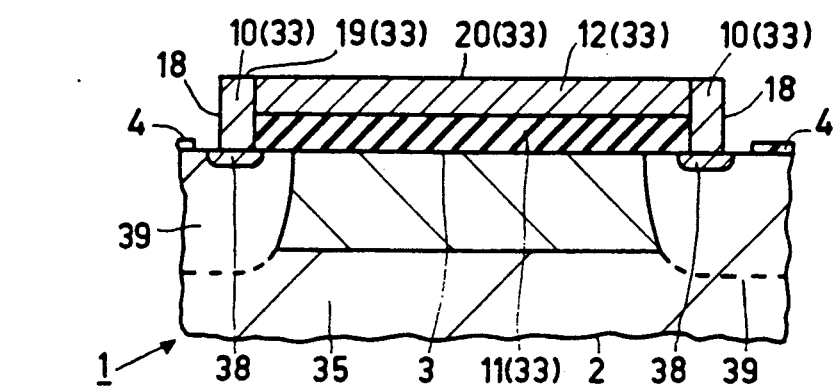

The junction field effect transistor of FIGS. 16 to 18 inclusive comprises on a p-type substrate 35 an n-type epitaxial layer 36, in which a source zone 30 and a drain zone 31 are formed, which are contacted through polycrystalline rims 10 having perpendicular side walls 18, these rims 10 forming part of an interconnection pattern 9, 10. The parts 9 consist of a layer 11 of oxide and a juxtaposed layer 12 of polycrystalline silicon. The rims 10 and the polycrystalline silicon 12 adjoining the source and drain zones 30, 31 are, like these zones 30, 31 and the epitaxial layer 36, n-type conducting. Between the source zone 30 and the drain zone 31 there is provided a gate electrode pattern 9(33), 10(33), which comprises a p-type layer 12(33) of polycrystalline silicon and p-type rims 10(33). At the area of the rims 10(33) there are present in the epitaxial layer 36 two p-type gate zones 37. The conduction between the source zone 30 and the drain zone 31 is modulated with a voltage at the gate electrode, which may produce in the subjacent epitaxial layer a depletion zone 40 (FIG. 17). In this example, the substrate 35 acts as a bottom gate. For this purpose, the semiconductor body is provided outside the channel zone with deep p-diffusions 39. Due to the fact that the rims 10(33) of the gate electrode are arranged along the whole periphery, the gate electrode is electrically connected at the area of these p-diffusions 39 through contact zones 38 and these diffusion regions 39 to the substrate (see FIG. 18). Otherwise the reference numerals have the same meaning as in the preceding embodiments.

Figure 19:
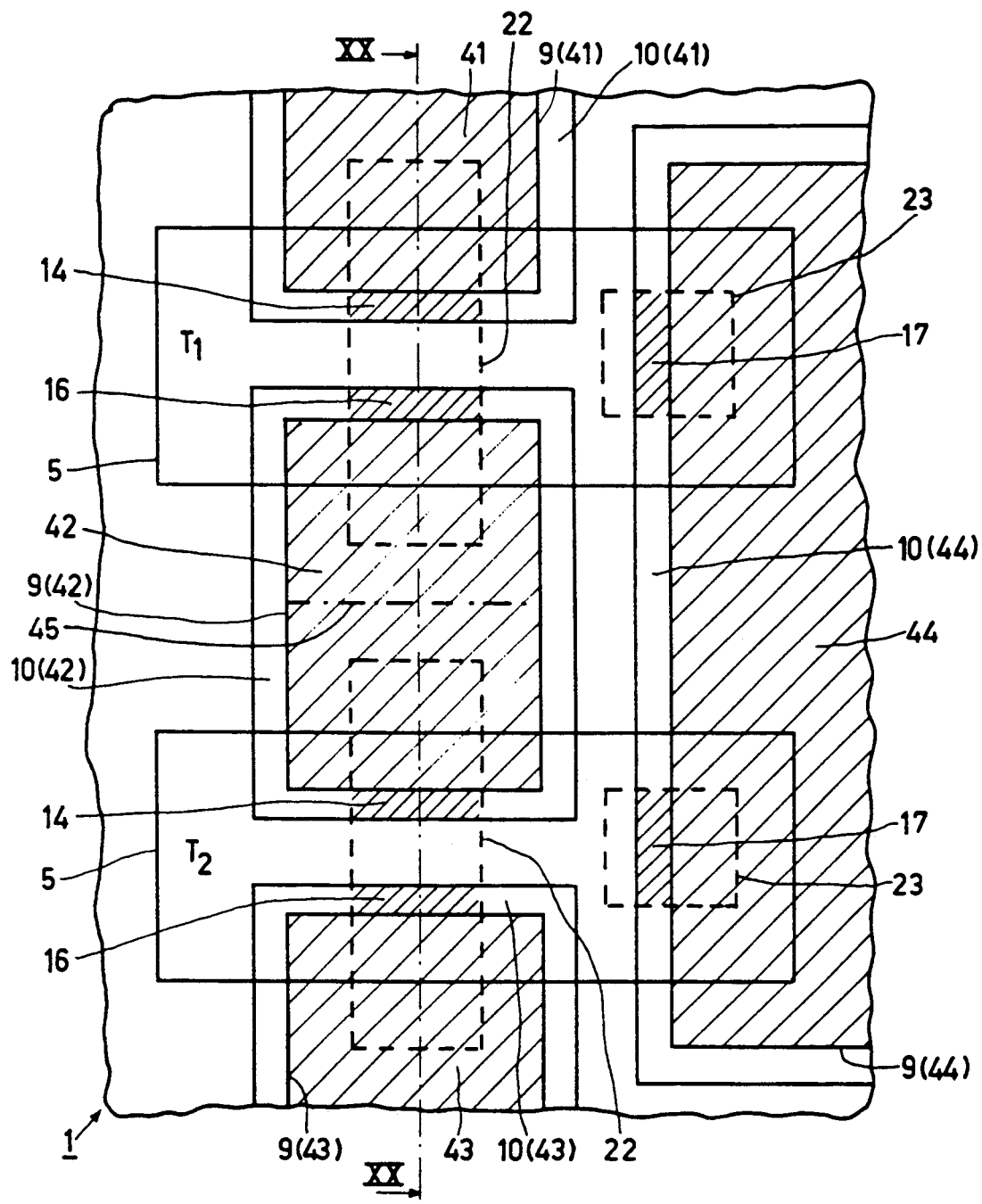
Figure 20:
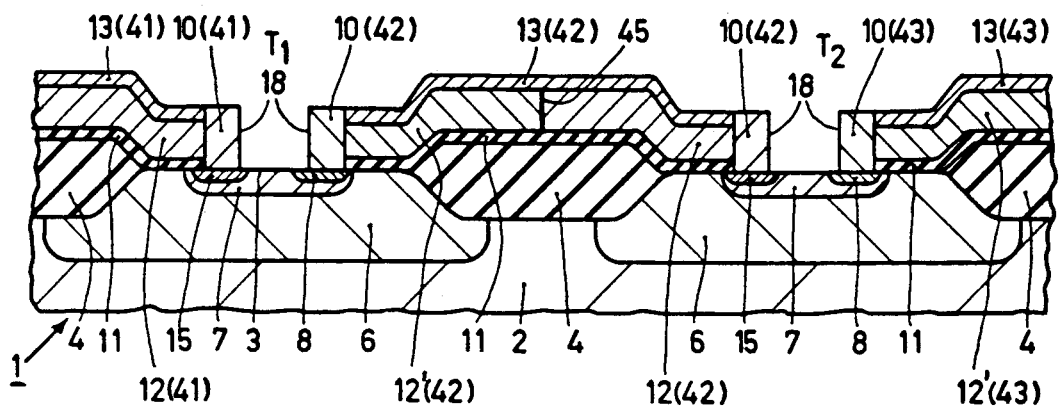
Figure 21:
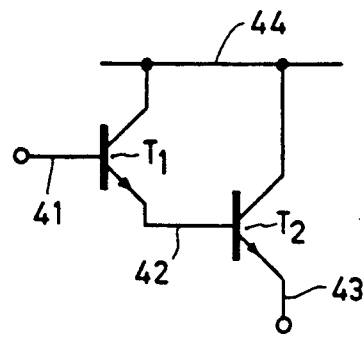

The circuit arrangement of FIGS. 19 to 21 inclusive includes two transistors $T_1$, $T_2$ with a common collector contact 44, which is constituted by a pattern 9(44) and an n-type rim 10(44). In this case, the pattern 9(44) is composed of three layers, i.e. a layer 11 of silicon oxide, a layer 12' (44) of n-type conducting polycrystalline silicon and a layer 13, which in this example consists of a layer of metal, for example, tungsten. In a similar manner, the base contact of the transistor $T_1$ is constituted by a p-type rim 10(41) and a pattern 9(41) composed of a layer 11 of silicon oxide, a layer 12(41) of p-type polycrystalline silicon and a layer of metal 13(41). The emitter of the transistor $T_1$ is connected through a pattern 9(42), 10(42) to the base of the transistor $T_2$. The rim 10(42) is n-type conducting at the area of the emitter of the transistor $T_1$ and p-type conducting at the area of the base of the transistor $T_2$. The pattern 9(42) comprises an insulating layer 11 and a polycrystalline layer of silicon, which is subdivided into a part 12'(42) of n-conductivity type and part 12(42) of p-conductivity type. The pn-junction 45 thus formed is short-circuited by the metal layer 13(42). In a similar manner the emitter contact 43 is constituted by an n-type conducting rim 10(43) and a pattern 9(43) composed of a layer 11 of silica, a layer 12'(43) of n-type polycrystalline silicon and a metallization layer 13(43).

Figure 22:
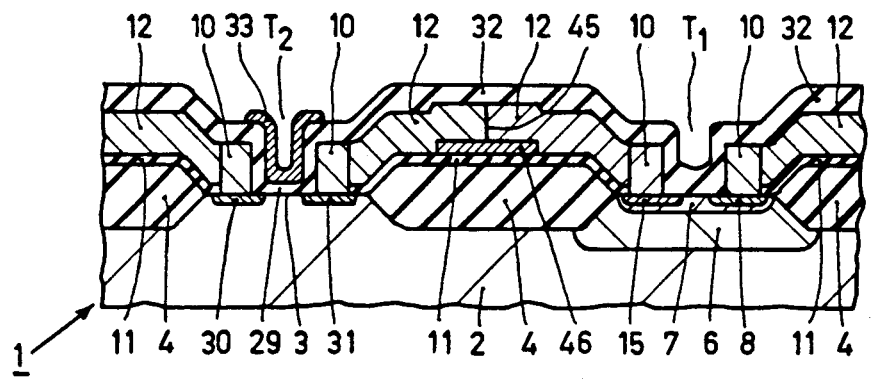
FIG. 22 is a schematic cross-sectional view of a device, in which beside a bipolar transistor a MOS transistor is formed.

FIG. 22 shows in cross-section a bipolar transistor $T_1$, the base zone 7 of which is connected in an electrically conducting manner to the drain zone 31 of the MOS transistor $T_2$. The MOS transistor $T_2$ is manufactured in the same manner as that of FIG. 14; during the application of the gate oxide 29, the semiconductor surface 3 also oxidizes at the area of the transistor $T_1$, but this has no or substantially no effect on the operation of the transistor $T_1$. The pn-junction 45 in the polycrystalline silicon 12 is short-circuited in this device by means of a metal layer 46, which has been provided at the area of this pn-junction on the oxide layer 11 already before the provision of the layer 12 of polycrystalline silicon.

It stands to reason that the invention is not limited to the above examples, but that many variations are possible for those skilled in the art within the scope of the invention.

Thus, a semiconductor device, which is comparable with that of FIGS. 1, 2, can be obtained in that as a starting member a p-type substrate is used, on which an n-type epitaxial layer is grown. Separate collector regions are then obtained by means of pn insulation or dielectric insulation. Prior to the application of the epitaxial layer a buried layer can be defined for reducing the collector series resistance.

The MOS transistor of FIG. 14 may also be provided in a p-type conducting surface zone which is located in an n-type substrate; in such a device, n-type and p-type MOS transistors may then be manufactured in one semiconductor body.

In the above examples, the rim 10 encloses the pattern 9 entirely. However, this is not absolutely necessary. With the aid of additional masks which locally protect the semiconductor body, it is possible to selectively apply the rim 10. In the device of FIG. 16, it is then possible to provide only one gate zone 37. Otherwise, in this device the pattern 9 of the gate electrode may extend outside the plane of the drawing for connection to other circuit elements.

The metal 46, which in FIG. 22 lies below the pn junction 45, may also be deposited on this junction. The shortcircuit may also be obtained through a conductive layer on an insulating layer on both sides of the pn junction 45, which forms through contact windows ohmic contacts with the polycrystalline silicon.

As a matter of course, various modifications are also possible for the methods shown.

What is claimed is:

1. A method of manufacturing a semiconductor device of a bipolar transistor characterized in that the starting member is a semiconductor body comprising an insulating layer which is present on a surface and in which at least an opening is provided while a layer pattern is formed which extends at least as far as an edge of the opening, whereupon at least at the area of the opening a layer is provided on the semiconductor body and on the layer pattern consisting of a material which is subjected impurities in the semiconductor body determining the first conductivity type diffuse through another part of the rim into the semiconductor body in order to form an emitter zone.

2. A method as claimed in claim 1 inclusive, characterized in that at least at the area of a pn junction in the semiconductor material the layer pattern is provided with a layer of conducting material which shortcircuits the pn junction.

3. A method as claimed in claim 1, characterized in that the anisotropic etching treatment is carried out, and in that the layer to be etched is brought into contact with constituents of a plasma.

4. A method of manufacturing a field effect transistor, characterized in that a semiconductor device having an interconnection pattern comprising parts of a layer of polycrystalline semiconductor material and rims of semiconductor material is subjected to an oxidation treatment, in which impurities of a first conductivity type diffuse into a semi-conductor zone of a second conductivity type opposite to the first conductivity type and thus form source and drain zones of the field effect transistor, while at the area of the side walls of the interconnection pattern oxide grows more rapidly than on the semiconductor surface in the opening in which a gate electrode is provided on the oxide.

5. A method as claimed in claim 4, characterized in that prior to the oxidation treatment a cavity is formed in the semiconductor body between the source zone and the drain zone.

6. A method as claimed in claim 4, characterized in that at least at the area of a pn junction in the semiconductor material a layer pattern is provided with a layer of conducting material which short-circuits the pn junction.

* * * * *